(12) United States Patent
Mitrofanov

(10) Patent No.: US 7,336,062 B2
(45) Date of Patent: Feb. 26, 2008

(54) OPTICALLY MEASURING ELECTRIC FIELD INTENSITIES

(75) Inventor: Oleg Mitrofanov, New York, NY (US)

(73) Assignee: Lucent Technologies Inc., Murray Hill, NJ (US)

( * ) Notice: Subject to any disclaimer, the term of this patent is extended or adjusted under 35 U.S.C. 154(b) by 269 days.

(21) Appl. No.: 10/983,864

(22) Filed: Nov. 8, 2004

(65) Prior Publication Data

US 2006/0098695 A1  May 11, 2006

(51) Int. Cl.
*G01R 31/00* (2006.01)
(52) U.S. Cl. ........................................ 324/96
(58) Field of Classification Search ........... 250/227.17; 356/465, 486, 461, 440, 497, 456; 324/95, 324/158.1, 765, 750, 752, 227.17; 372/9, 372/92, 29.02, 6
See application file for complete search history.

(56) References Cited

U.S. PATENT DOCUMENTS

| | | | |
|---|---|---|---|
| 5,963,034 A | 10/1999 | Mahapatra et al. | 324/244.1 |
| 6,677,769 B2 | 1/2004 | Whitaker et al. | 324/753 |
| 6,798,960 B2 | 9/2004 | Hamada | 385/122 |
| 6,870,624 B2 * | 3/2005 | Hobbs et al. | 356/416 |
| 2001/0054681 A1 | 12/2001 | Hamada | 250/227.11 |
| 2003/0164947 A1 | 9/2003 | Vaupel | 356/445 |

FOREIGN PATENT DOCUMENTS

| | | |
|---|---|---|
| EP | 1168008 | 1/2002 |
| JP | 07027696 A * | 1/1995 |

OTHER PUBLICATIONS

X. Zheng, et al, "Electro-optic sampling system with a single-crystal 4-N, N-dimethylamino-4'-N'- methyl-4-stilbazolium tosylate sensor," American Institute of Physics, *Applied Physics Letters*, vol. 82, No. 15, (Apr. 14, 2003), pp. 2383-2385.

J. L. Freeman, et al, "Electro-optic sampling of planar digital GaAs integrated circuits," American Institute of Physics, *Applied Physics Letters*, vol. 47, No. 10, (Nov. 15, 1985), pp. 1083-1084.

Michael S. Heutmaker, et al, "Electro-optic sampling of high-speed silicon integrated circuits using a GaAs probe tip," American Institute of Physics, *Applied Physics Letters*, vol. 59, No. 2, (Jul. 8, 1991), pp. 146-148.

(Continued)

*Primary Examiner*—Ha Tran Nguyen
*Assistant Examiner*—Tung X. Nguyen
(74) *Attorney, Agent, or Firm*—John F. McCabe

(57) ABSTRACT

An apparatus includes an optical resonator and a passive optical device. The optical resonator has first and second optical reflectors and an optical cavity interposed between the reflectors. The optical resonator includes an electro-optically responsive material. One of the reflectors is a distributed Bragg reflector. A passive optical device is configured to direct light through the first optical reflector. The optical resonator is configured to return a portion of the light through the first reflector.

10 Claims, 4 Drawing Sheets

OTHER PUBLICATIONS

D. R. Dykaar, et al, "Electro-optic sampling using an aluminum gallium arsenide probe," American Institute of Physics, *Applied Physics Letters*, vol. 62, No. 15, (Apr. 12, 1993), pp. 1733-1735.

S. Loualiche, et al, "40 GHz Measurement on InP/Air Gap Line by Picosecond Electro-Optic Sampling," *Electronics Letters*, vol. 26, No. 4, (Feb. 15, 1990), pp. 266-267.

K. Yang, et al, "Electro-optic field mapping system utilizing external gallium arsenide probes," American Institute of Physics, *Applied Physics Letters*, vol. 77, No. 4, (Jul. 24, 2000), pp. 486-488.

Torsten Pfeifer, et al, "Optoelectronic On-Chip Characterization of Ultrafast Electric Devices: Measurement Techniques and Applications," *IEEE Journal of Selected Topics in Quantum Electronics*, vol. 2, No. 3, (1996), pp. 586-604.

Wen-Kai Kuo, et al, "Two-dimensional electric-field vector measurement by a LiTaO$_3$ electro-optic probe tip," *Applied Optics*, vol. 39, No. 27, (Sep. 20, 2000), pp. 4985-4993.

Wen-Kai Kuo, et al, "Three-dimensional electric-field vector measurement with an electro-optic sensing technique," Optical Society of America, *Optics Letters*, vol. 24, No. 22, (Nov. 15, 1999), pp. 1546-1548.

Nabil Sahri, et al, "Packaged Photonic Probes for an On-Wafer Broad-Band Millimeter-Wave Network Analyzer," *IEEE Photonics Technology Letters*, vol. 12, No. 9, (2000), pp. 1225-1227.

M. Shinagawa, et al, "Electro-Optic Sampling Using an External GaAs Probe Tip," *Electronics Letters*, vol. 26, No. 17, (Aug. 16, 1990), pp. 1341-1343.

Gong-Ru Lin, "Optoelectronic delay-time controller for laser pulses," Optical Society of America, *Optics Letters*, vol. 25, No. 11, (Jun. 1, 2000), pp. 799-801.

J. M. Zhang, et al, "Noise suppression in Ti:sapphire laser-based electro-optic sampling," American Institute of Physics, *Applied Physics Letters*, vol. 75, No. 22, (Nov. 29, 1999), pp. 3446-3448.

J. M. Wiesenfeld, et al, "Electro-optic sampling measurements of high-speed InP integrated circuits," American Institute of Physics, *Applied Physics Letters*, vol. 50, No. 19, (May 11, 1987), pp. 1310-1312.

T. Shibata, et al, "Effective Optical Transit Time in Direct Electro-Optic Sampling of GaAs Coplanar Integrated Circuits," *Electronics Letters*, vol. 25, No. 12, (Jun. 8, 1989), pp. 771-773.

L. Duvillaret, et al, "Absolute voltage measurements on III-V integrated circuits by internal electro-optic sampling," *Electronics Letters*, vol. 31, No. 1, (Jan. 5, 1995), pp. 23-24.

H-H Wu, et al, "Electro-optic sampling of optoelectronically phase-locked 10.0 GHz microwave signals using semiconductor laser diodes," *Electronics Letters*, vol. 27, No. 18, (Aug. 29, 1991), pp. 1622-1623.

J. F. Lampin, et al, "Detection of picosecond electrical pulses using the intrinsic Franz-Keldysh effect," American Institute of Physics, *Applied Physics Letters*, vol. 78, No. 26, (Jun. 25, 2001), pp. 4103-4105.

Taiichi Otsuji, et al, A 105-GHz Bandwidth Optical-to-Electrical Conversion Stimulus Probe Head Employing a Unitraveling-Carrier Photodiode, *IEEE Photonics Technology Letters*, vol. 11, No. 8, (1999), pp. 1033-1035.

Gong-Ru Lin, et al, "A Novel Electro-Optic Sampling System with a Delay-Time-Tunable pulsed laser diode," *Microwave and Optical Technology Letters*, vol. 28, No. 6, (Mar. 20, 2001), pp. 432-434.

Janis A. Valdmanis, et al, "Subpicosecond Electrooptic Sampling: Principles and Applications," *IEEE Journal of Quantum Electronics*, vol. QE-22, No. 1, (1986), pp. 69-78.

Ralf Hofmann, et al, "Electro-Optic Sampling System for the Testing of High-Speed Integrated Circuits Using a Free Running Solid-State Laser," *Journal of Lightwave Technology*, vol. 14, No. 8, (1996), pp. 1788-1793.

Thomas Y. Hsiang, et al, "Propagation characteristics of picosecond electrical transients on coplanar striplines," American Institute of Physics, *Applied Physics Letters*, vol. 51, No. 19, (Nov. 9, 1987), pp. 1551-1553.

J. Allam, et al, "Monolithically-integrated optoelectronic circuit for ultrafast sampling of a dual-gate field-effect transistor," *Optical and Quantum Electronics*, vol. 28, (1996), pp. 875-896.

Michael Y. Frankel, et al, "Experimental Characterization of External Electrooptic Probes," *IEEE Microwave and Guided Wave Letters*, vol. 1, No. 3, (1991), pp. 60-62.

Antonello Cutolo, "Selected contactless optoelectronic measurements for electronic applications," American Institute of Physics, *Review of Scientific Instruments*, vol. 69, No. 2, (Feb. 1998), pp. 337-360.

S. M. Chandani, et al, Fiber-Based Electro-Optic Sampling for In-Circuit Probing, University of British Columbia, Dept. of Electrical and Computer Engineering, *Ultrafast Electronics & Fiber Optics Lab*, Conference Presentation, (May, 2002), slides 1-18.

* cited by examiner

OPTICALLY MEASURING ELECTRIC FIELD INTENSITIES

The U.S. Government has a paid-up license in this invention and the right in limited circumstances to require the patent owner to license others on reasonable terms as provided for by the terms of Contract No. HR0011-04-C-0048 awarded by DARPA Tactical Technology Office (TTO).

BACKGROUND

1. Field of the Invention

This invention relates generally to the measurement of electric fields and more specifically to the use of the electro-optic effect to measure intensities of such fields.

2. Discussion of the Related Art

In various situations, it is desirable to measure the intensity of an electric field. One method for making such measurements involves using a bulk crystal having an electro-optic (EO) effect. In particular, a non-centrosymmetric crystal responds to an applied electric field via an EO effect. In the EO effect, application of an electric field changes a refractive index of a material. Due to the EO effect, light traveling through an electro-optically responsive material acquires a phase retardation proportional to the intensity of an applied electric field.

One conventional method for measuring the intensity of an electric field involves placing a bulk electro-optically responsive crystal in the electric field and directing a probing beam of light onto the bulk crystal. As the light traverses the bulk crystal, it accumulates a phase retardation that depends on the crystal's refractive index. Due to the EO effect, the value of the refractive index also depends on the intensity of the electric field. The method includes finding the intensity by measuring the phase retardation that the light accumulates while passing through the bulk crystal.

While some materials have a large EO effect, such materials are not always desirable for use in EO probes for measuring intensities of electric fields. In particular, such materials often have a large low-frequency dielectric constant. The large low-frequency dielectric constant increases the interaction between such materials and samples thereby making their use in EO measurements of field intensities invasive. Thus, materials with low or moderate EO coefficients may be preferable in EO probes for measuring the intensities of electric fields. Unfortunately, measuring the accumulated phase retardation is also more difficult when the probe is made with a material having a low or moderate EO effect.

SUMMARY

Various embodiments provide apparatus and methods for EO measurement of intensities of electric fields. The apparatus typically include a probe having an electro-optically responsive material. To increase the probe's sensitivity to an electric field, the probe incorporates an electro-optically responsive optical resonator in which the probing light makes multiple traverses of the resonator's cavity. The multiple traverses enable a phase retardation produced by an applied electric field to accumulate. For this reason, an electro-optically responsive optical resonator can provide adequate sensitivity and still have significantly smaller linear dimensions than a bulk EO crystal. The smaller linear dimensions enable the measurement of variations in an electric field with a higher spatial resolution than is available with measurement probes that use bulk EO crystals.

One embodiment provides an apparatus that includes an optical resonator and a passive optical device. The optical resonator has first and second optical reflectors and an optical cavity interposed between the reflectors. The optical resonator includes an electro-optically responsive material. One of the reflectors is a distributed Bragg reflector. A passive optical device is configured to direct light through the first optical reflector. The optical resonator is configured to return a portion of the light through the first reflector.

Another embodiment provides a method for measuring an intensity of an electric field. The method includes positioning an electro-optically responsive optical resonator in the electric field. The optical resonator has first and second optical reflectors and an optical cavity between the reflectors. One of the optical reflectors is a distributed Bragg reflector. The method includes transmitting light through the first optical reflector into the optical resonator and includes receiving a portion of the light transmitted into the optical resonator. The portion is received through the first optical reflector.

BRIEF DESCRIPTION OF THE FIGURES

In the Figures, like reference numerals indicate elements having similar functions.

In the Figures, dimensions of some objects have been magnified or reduced to better illustrate features of the objects.

While various embodiments are described by the detailed description and Figures, the inventions may be embodied in other forms and are not limited to the illustrative embodiments described herein.

DETAILED DESCRIPTION OF ILLUSTRATIVE EMBODIMENTS

Figure 1:
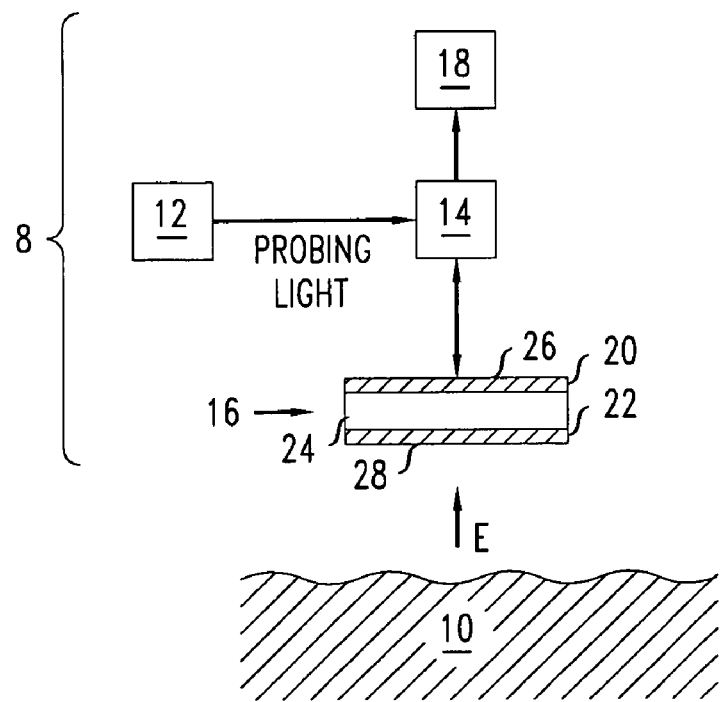
FIG. 1 is a block diagram of an apparatus for electro-optically measuring an intensity of an electric field.

FIG. 1 shows an electro-optic (EO) apparatus 8 that is capable of measuring the intensity of a component of an electric field, E, with a high spatial resolution. Some embodiments of the EO apparatus 8 use infrared light to measure an intensity pattern of a component of an electric field to a vertical spatial resolution of about 5 micrometers (µ) or better and can produce a vertical spatial resolution of at least 2µ. With visible light, other embodiments may be able to produce even better spatial resolutions. Thus, some embodiments of the EO apparatus 8 are able to measure the intensities of components of electric fields at a distance of a few microns from the surface of an object 10. These embodiments of the EO apparatus 8 may be useful for tests of integrated circuits, which are based on mapping electric field patterns near said circuits.

The EO apparatus 8 includes a laser source 12, an optical beam splitter 14, an optical resonator 16, and an optical detector 18.

The laser source 12 transmits a beam of probing light to the optical beam splitter 14. The optical beam splitter reflects or redirects the probing light towards the optical resonator 16.

The optical resonator 16 includes an electro-optically responsive Fabry-Perot etalon that includes top and bottom dielectric optical reflectors 20, 22 and an optical cavity 24 interposed between the top and bottom dielectric optical reflectors 20, 22. Since the optical reflectors 20, 22 are dielectric structures, the optical resonator 16 is less disruptive of the electric field being measured than would be an optical resonator having metallic reflectors. The top dielectric optical reflector 20 has a higher transmissivity than the bottom dielectric optical reflector 22 so that some incident probing light is transmitted into the optical resonator 16 via top surface 26. The bottom dielectric optical reflector 22 has a high reflectivity so that little probe light leaks through bottom surface 28.

The dielectric optical reflectors 20, 22 cause the probing light to undergo multiple reflections thereby increasing the optical path in the optical resonator 16. The longer optical path increases the interaction time inside the EO material of the micro-optical cavity 16. After performing such reflections, a substantial portion of the probe light is returned through the top dielectric optical reflector 20 towards optical beam splitter 14.

The returned probing light has a phase retardation that has been increased by the multiple reflections in the optical resonator 16. The optical resonator 16 includes one or more electro-optic materials that cause the phase retardation of returned probing light to depend on the intensity of electric fields in the optical resonator 16. In the optical resonator 16, the multiple reflections significantly increase the size of this electro-optically induced phase retardation. Thus, thin optical resonators 16, e.g., optical resonators thinner than about 5μ, are able to induce measurable phase retardations in the probing light.

The optical beam splitter 14 transmits the light received from the optical resonator 16 towards the optical detector 18.

The optical detector 18 is configured to measure a quantity representative of phase retardation and/or polarization rotation that the optical resonator 16 produces in the probing light. From the measured values of the quantity, the EO apparatus 8 determines the intensity of the electric field in spatial region occupied by the optical resonator 16.

Figure 2:
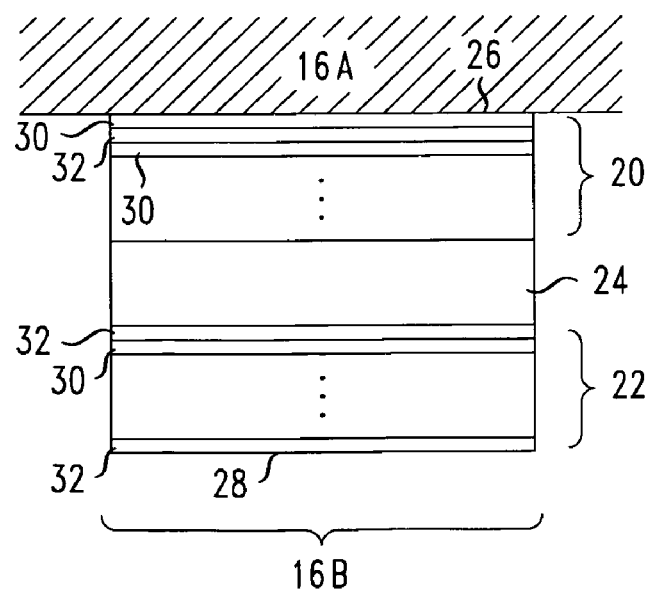
FIG. 2 is a cross-sectional view of an electro-optically responsive micro-optical resonator that may be used in the apparatus of FIG. 1.

FIG. 2 shows one embodiment of the optical resonator 16 of FIG. 1. The optical resonator 16 includes a support substrate 16A and a micro-optical resonator 16B bonded to the support substrate 16A. The support substrate 16A is a transparent planar slab of a non-EO material such as silica-glass. The micro-optical resonator 16B has top and bottom dielectric optical reflectors 20, 22 that are distributed Bragg reflectors. Each Bragg reflector includes alternating GaAs layers 30 and $Al_xGa_{(1-x)}As$ layers 32 where Al, Ga, and As are aluminum, gallium, and arsenic, respectively. Each GaAs layer 32 and $Al_xGa_{(1-x)}As$ layer 30 has a thickness equal to ¼ times the effective wavelength of the probing light therein. The top and bottom reflectors include multiple pairs of GaAs and $Al_xGa_{(1-x)}As$ layers 30, 32. Preferably, x $\epsilon$ [0.5, 1.0] and is close to 1.0 so that the refractive index contrast between the GaAs and $Al_xGa_{(1-x)}As$ layers 30, 32 is large and less of said layers 30, 32 are needed to produce a desired reflectivity. The micro-optical resonator 16B has an optical cavity 24 that is a single GaAs layer. This single GaAs layer has a thickness equal to a positive odd integer multiple of ½ times the effective wavelength of the probing light therein.

In various embodiments, the top optical reflector 20 has less pairs of the GaAs and AlGaAs layers 30, 32 than the bottom optical reflector 22. For that reason, the top reflector 20 has a higher transmissivity than the bottom optical reflector 22 and the micro-optical resonator is optically unbalanced. The ratio of the transmissivity of the top optical reflector 20 over that of the bottom optical reflector 22 is typically, at least, 1.6, is preferably, at least, about 2.5, and is more preferably about 17 or higher. Transmissivity ratios of 1.6, 2.5, and 17 should cause the micro-optical cavity 16B to reflect back respectively about 20%, 33%, and 85% of the probing light incident on the top surface 26. Due to its higher transmissivity, the top optical reflector 20 partially transmits probing light thereby enabling the micro-optical cavity 16B to be pumped with the probing light via the top surface 26. Due to the unbalance, the micro-optical cavity 16B will also transmit less probing light to the underlying object 10 of FIG. 1. The lack of such transmission is desirable, because transmitted probing light could otherwise cause undesirable effects such as heating of the object 10, generation of photo-carriers in the object 10, or reflective production of background light.

Figure 3:
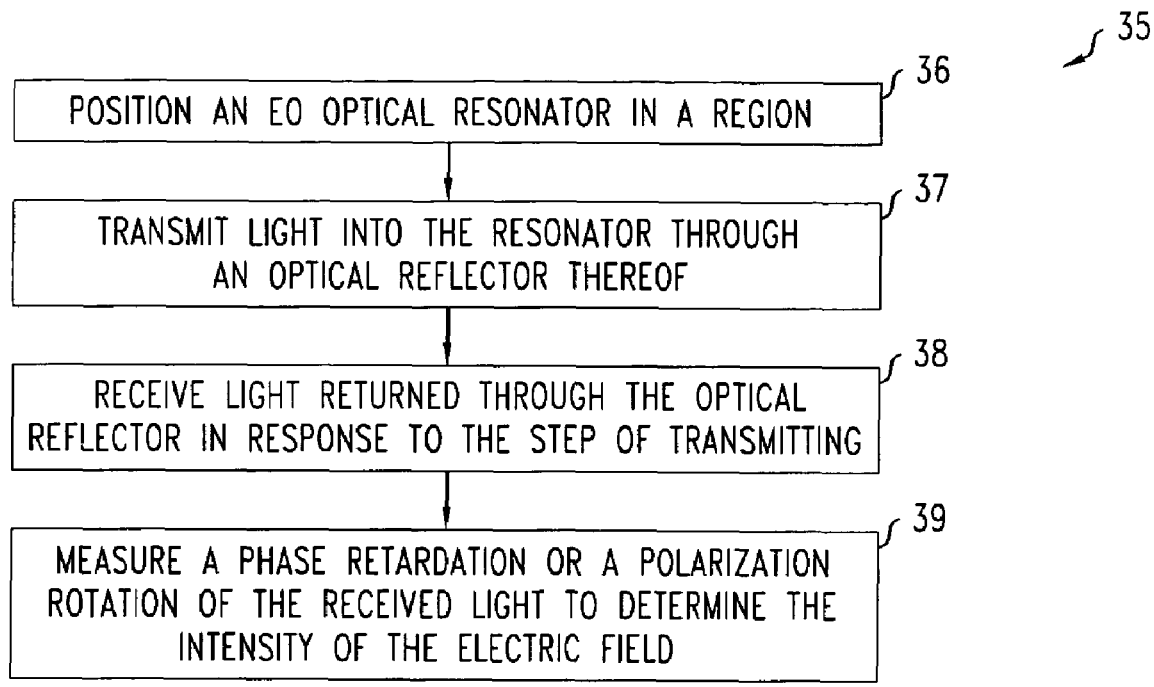
FIG. 3 is a flow chart for a method of operating the apparatus of FIG. 1.

FIG. 3 illustrates a method 35 for measuring the intensity of one component of an electric field, e.g., using EO apparatus 8 of FIG. 1.

The method 35 includes positioning an electro-optically responsive optical resonator in the region where the intensity of a component of an electric field is to be measured (step 36). The optical resonator has first and second dielectric optical reflectors and an optical cavity interposed between the optical reflectors. One or both of the optical reflectors are distributed Bragg reflectors.

The method 35 includes transmitting probing light through the first dielectric optical reflector so that the light enters the optical resonator (step 37). The dielectric optical reflectors of the optical resonator are configured so that the probing light makes multiple reflections in the optical resonator.

The method 35 includes receiving a portion of the light transmitted into the optical resonator through the same first optical reflector (step 38). That is, the optical resonator reflects back a portion of the received light after said light has undergone reflections inside the optical resonator, i.e., to traverse a path through the electro-optically responsive material of the optical resonator.

The method 35 includes measuring a phase retardation or polarization rotation of the received portion of the light to determine the intensity of a component of the electric field in the optical cavity (step 39). The measurement step may determine the intensity of a component normal to the plane of the optical resonator or tangential to said plane. Exemplary configurations of incident probing light that enable measuring said components of the electric field are illustrated in FIGS. 4 and 5.

Figure 4:
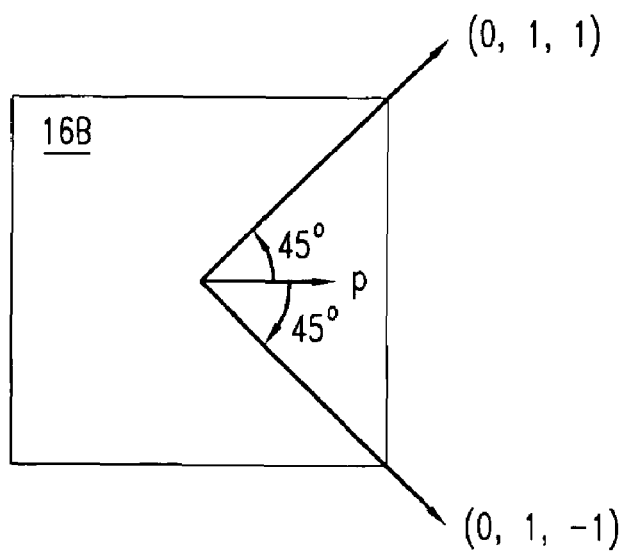
FIG. 4 is a top view of one embodiment of the micro-optical resonator of FIG. 2 that illustrates one polarization for incident probing light.

FIG. 4 shows an exemplary orientation of the polarization, P, of incident probing light when the GaAs and AlGaAs layers 24, 30, 32 have the (1 0 0) lattice orientation. The (1 0 0) layer orientation enables measurements of the intensity of the electric field component normal to top surface 26 if P has a nonzero component along both (0 1 1) and (0 1-1) lattice directions of the GaAs and AlGaAs layers 30, 24, 32. For example, P may be oriented at 45 degrees to both (0 1 1) and (0 1-1) lattice directions as shown in FIG. 4. For these orientations of P, measurements of phase retardations enable determinations of the intensities of electric fields, because the difference between the refractive indices for polarizations along the (0 1 1) and the (0 1-1) lattice directions is proportional to the intensity of the normal component of an electric field.

Other exemplary orientations of the polarization, P, of incident probing light would be appropriate when the GaAs and AlGaAs layers 24, 30, 32 have the (1 1 0) lattice orientation. The (1 1 0) orientation for the GaAs and AlGaAs layers 24, 30, 32 could enable measurements of the intensity of the electric field component tangential to top surface 26.

Figure 5:
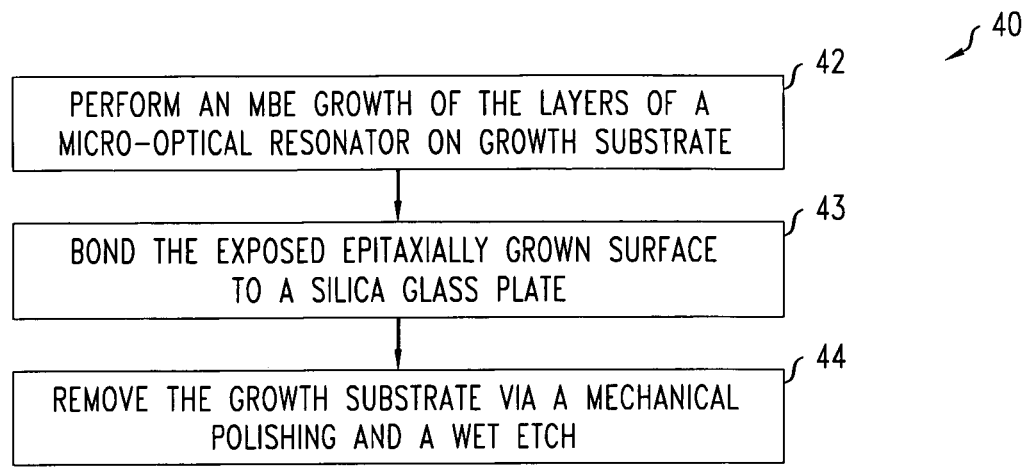
FIG. 5 is a flow chart that illustrates one method of fabricating the electro-optically responsive micro-optical resonator of FIG. 2.
Figure 6:
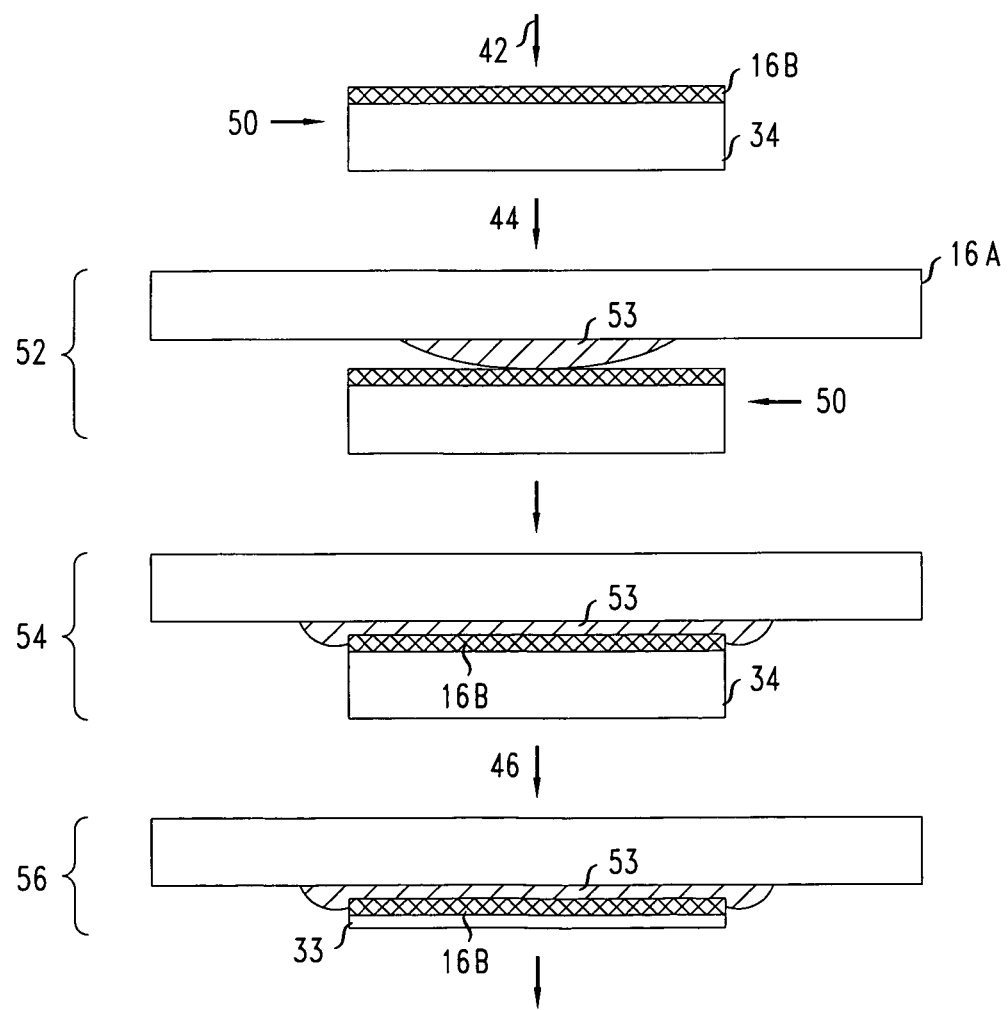
FIG. 6 shows cross-sectional views of intermediate structures fabricated during performance of the method of FIG. 5.

FIG. 5 illustrates a method 40 of fabricating the micro-optical resonator 16 shown in FIG. 2. The method 40 produces intermediate structures 50, 52, 54, 56, which are shown in FIG. 6.

The method 40 includes performing a conventional molecular beam epitaxy (MBE) to grow the GaAs and $Al_xGa_{(1-x)}As$ layers of the micro-optical resonator 16B on a GaAs growth substrate 34 as shown in structure 50 (step 42). The orientation of the GaAs growth substrate 34 at the initial GaAs growth surface determines the lattice orientations of the GaAs layers 30, 24 and AlGaAs layers 32. To produce the (1 0 0) lattice orientation in the GaAs and AlGaAs layers 24, 30, 32, the initial GaAs growth surface should have the (1 0 0) lattice orientation.

The method 40 includes bonding the epitaxially grown surface of intermediate structure 50 to the surface of the silica-glass plate 16A (step 44). The bonding step involves liquefying a bondant 53, e.g., by heating. The bondant is positioned between the silica-glass plate 16A and the top surface 26 of the epitaxially grown surface of the structure 50 as shown in intermediate structure 52. The bonding step also involves pressing the silica-glass plate 16A and intermediate structure 50 together to produce a thin layer of the liquefied bondant 53, e.g., having a thickness of 5µ or less. The bonding step also involves causing the bondant to solidify, e.g., by cooling, as shown in intermediate structure 54. Exemplary bondants include waxes that liquefy upon melting and that are index-matched to the silica-glass plate 16A when solidified. One such wax melts when heated to about 100° C. and is available as Stronghold 7036 Blanchard Wax from J.H. Young Company, Inc., 8 Symington Place, Rochester, N.Y. 14611 USA.

The method 40 includes removing the GaAs growth substrate 34 via a two-step process thereby producing the mounted micro-optical resonator 16 (step 46). The first step involves mechanical polishing away most of the GaAs substrate 34 to produce intermediate structure 56. The intermediate structure 56 includes a remaining GaAs layer 33 that is about 10-12µ thick. The mechanical polishing may, e.g., use the Fibrmet Optical Fiber Polisher of Buehler Company, 41 Waukegan Rd. P.O. Box 1, Lake Bluff, Ill. 60044-1699 USA and an aluminum-oxide or diamond-dust grinding paper. Preferably, the final polishing uses a grinding paper in which the abrasive particles have diameters of about 0.3µ or less. The second step involves performing a wet etch to remove the remaining GaAs layer 33. The wet etch stops on the lowest AlGaAs layer 30, because the wet etchant is selected to etch AlGaAs much slower than it etches GaAs. In particular, the semiconductor surface of the intermediate structure 56 becomes visibly more reflective when the AlGaAs layer 33 is reached due to the slower etch rate in AlGaAs.

An exemplary wet etchant is made by mixing 500 ml of an ammonium hydroxide ($NH_4OH$) solution and 6 ml of a hydrogen peroxide ($H_2O_4$) solution. The ammonium hydroxide solution includes 28-30 volume percent $NH_4OH$ in water. The hydrogen peroxide solution includes about 30 volume percent $H_2O_4$ in water. Such a wet etchant is available from J.T. Baker Company of Mallinckrodt Baker, Inc. 222 Red School Lane, Phillipsburg, N.J. 08865.

Figure 7:
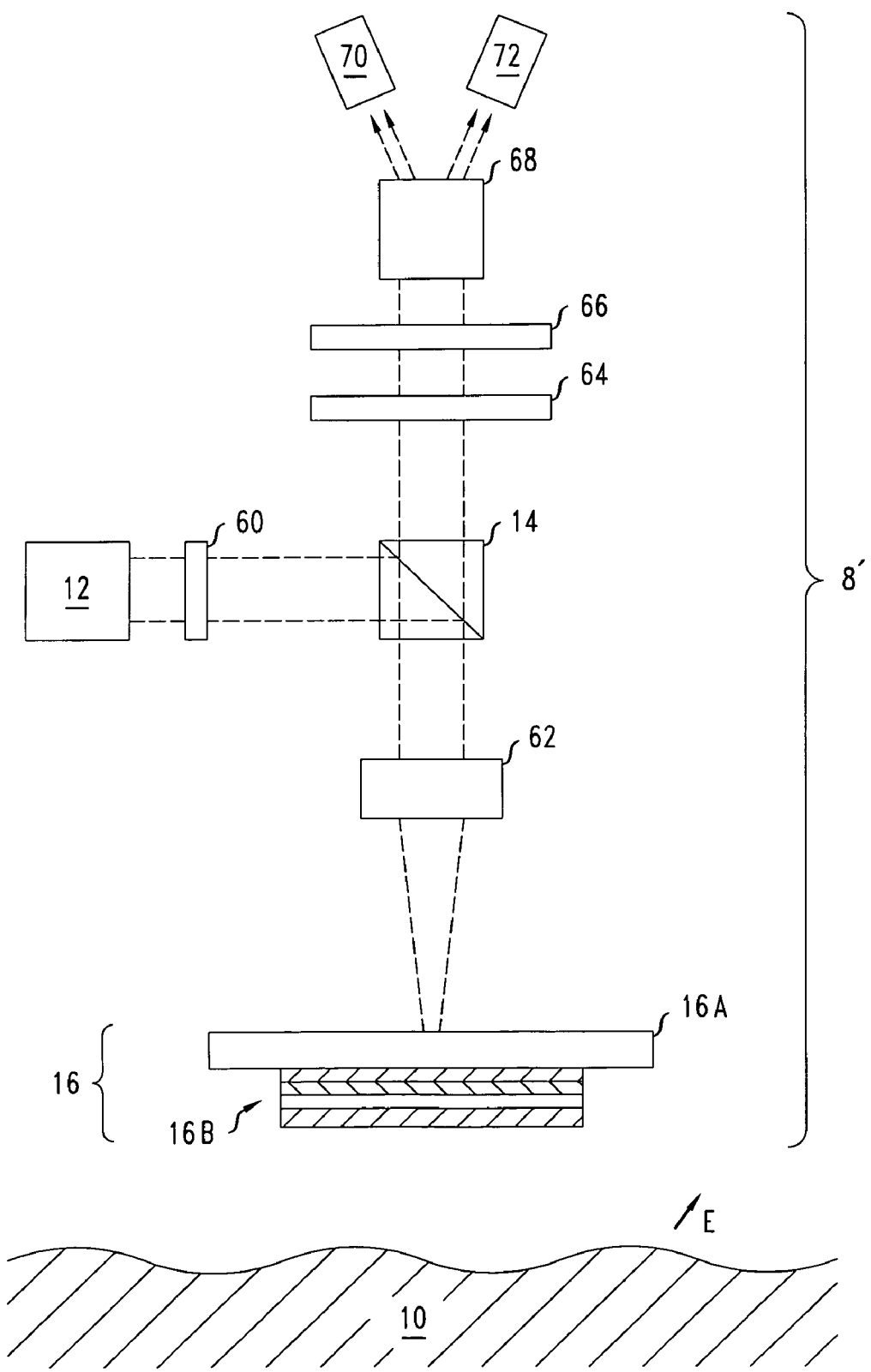
FIG. 7 shows a specific embodiment of the apparatus of FIG. 1 that incorporates the micro-optical resonator of FIG. 2.

FIG. 7 shows a specific embodiment 8' of the EO apparatus 8 of FIG. 1. The EO apparatus 8' includes a probe path, a micro-optical cavity 16, and a detection path.

The probe path includes laser source 14, polarizer 60, beam splitter 14, and focusing optics 62. The laser source 14 produces a monochromatic continuous-wave beam of infrared probe light having a wavelength of about 980 nm. An exemplary laser source 14 is the continuous-wave model-LQC980-14P laser, which is available from Newport Corporation of 1791 Deere Ave., Irvine, Calif. 92606 USA. The combination of the laser source 14 and polarizer 60 produce a linearly polarized beam of infrared probing light. One suitable polarizer 60 is the model-5525 Glan-Thompson polarizer that is available from New Focus Company, 2584 Junction Avenue, San Jose, Calif. 95134 USA. The beam splitter 14 reflects or directs a portion of the light received from the polarizer 60 towards the focusing optics 62. In embodiments where the beam splitter 14 partially separates via polarization, the ratio of the transmitted intensities, $T_P/T_S$, from the beam splitter 14 should be less than the inverse of the square of the electro-optically induced phase shift that is produced in the micro-optical resonator 16B. Here, subscripts "P" and "S" refer to polarization components that are parallel and perpendicular to the plane of incidence, respectively. An exemplary polarizing beam splitter 14 is the model-03PBS065 polarizing beam splitter, which is available from Melles Griot, 2051 Palomar Airport Road, 200, Carlsbad, Calif. 92009 USA. In this exemplary polarizing beam splitter 14, the ratio $T_P/T_S$ has a value of about 150. The focusing optics 62 focuses the beam of probing light onto the bottom surface 28 of the micro-optical resonator 16B so that only a small lateral region of the optical micro-resonator 16B is illuminated. Due to the focusing, the lateral spatial resolution for the electric field measurements is limited to the lateral region of the optical micro-resonator 16B illuminated by the focused probing light. Exemplary focusing optics 62 is the model-5724-H aspheric lens or model 5722-H aspheric lens, which is available from the New Focus Company.

The micro-optical resonator 16B is an embodiment of the layered structure as shown in FIG. 2. For probing light with a free-space wavelength of 980 nm, the GaAs layers 30 are 70.2 nm thick, the $Al_{0.9}Ga_{0.1}As$ layers 32 are 82.4 nm thick, and the GaAs layer 24 is 140.4 nm thick. The top and bottom reflectors 20, 22 may, e.g., include about six and about fifteen pairs of GaAs and $Al_{0.9}Ga_{0.1}$. As layers 30, 32, respectively. Then, the micro-optical resonator 16B has a thickness of about 3.3 µ. The thickness of the micro-optical resonator 16B fixes a minimum vertical spatial resolution for the measurements of intensities of electric fields. In particular, the vertical region where probing light has a large intensity in the micro-optical resonator 16B defines the vertical spatial resolution. For measuring the intensity of respective normal and tangential components of an electric field, the GaAs and AlGaAs layers 24, 30, 32 of the micro-optical resonator 16B have a (1 0 0) family lattice-orientation and a (0 1 1) family lattice-orientation, respectively.

The detection path includes the focusing optics 62, the polarization beam splitter 14, a ¼-wave plate 64, a ½-wave plate 66, a polarization beam splitter 68, and photodetectors 70, 72. The ¼-waveplate and ½-wave plate are oriented at 0 degrees and 22.5 degrees, respectively, from the orientation of the polarization of light directed by the polarization beam splitter 14 towards the optical resonator 16. The orientation of the optical axis of the ½-wave plate 66 ensures that the beam splitter 68 effectively separates polarization components along directions rotated by 45 degrees with respect to the polarization of the probing light incident on the micro-optical resonator 16B. For the 980 nm probing light, exemplary ¼ and ½ wave plates are the respective 10RP44-4 and 10RP42-4 wave plates, which are available from the Newport Corporation. An exemplary polarization beam splitter 68 is the model 43-8549-000 Wollaston polarizing prism, which is available from Coherent Inc., 5100 Patrick Henry Drive, Santa Clara, Calif. 95054 USA Exemplary photodetectors 70, 72 are, e.g., model-2007 Nirvana photodetectors, which are available from the New Focus Company.

The detection path is configured to measure small phase retardations that are produced in the micro-optical resonator 16B. In the presence of an electric field, the micro-optical resonator 16B induces phase retardation between the two perpendicular linear polarization components of the probing light inside the micro-optical resonator 16B. This produces an elliptical polarization, which the detection path is configured to convert into intensity variations measured by the differential detector that is formed by the two photodetectors 70, 72. If the GaAs and AlGaAs layers 30, 24, 32 have the (1 0 0) lattice orientation, the optical micro-resonator 16B is preferably oriented so that the polarization of probe light makes a 45 degree angle with the (0 1 1) and (0 1 −1) lattice directions of the GaAs and AlGaAs layers 30, 24, 32.

From the disclosure, drawings, and claims, other embodiments of the invention will be apparent to those skilled in the art.

What is claimed is:

1. An apparatus comprising:
an optical resonator having first and second optical reflectors and an optical cavity interposed between the reflectors, the optical resonator comprising an electro-optically responsive material, one of the reflectors being a distributed Bragg reflector;
a passive optical device configured to direct light through the first optical reflector, the optical resonator being configured to return a portion of the light through the first reflector; and
an optical detector configured to measure a quantity indicative of an electro-optic induced phase retardation of the returned light.

2. The apparatus of claim 1, wherein the first optical reflector has a substantially lower reflectivity than the second optical reflector.

3. The apparatus of claim 2, wherein both optical reflectors are distributed Bragg reflectors.

4. The apparatus of claim 3, wherein the optical resonator includes a group III-V semiconductor with zinc-blende crystal structure.

5. The apparatus of claim 2, wherein the second reflector has a transmissivity that is at least 1.6 times than the transmissivity of the first reflector.

6. The apparatus of claim 1, wherein the passive optical device is a beam splitter.

7. The apparatus of claim 6, further comprising a light source configured to transmit linearly polarized light to the passive optical device.

8. The apparatus of claim 1, wherein the first optical reflector has a substantially higher transmissivity than the second optical reflector.

9. The apparatus of claim 1, further comprising a device configured to determine an intensity of a component of an electric field in the optical resonator based on the measured quantity indicative of a phase retardation.

10. The apparatus of claim 1, wherein the optical resonator has a thickness of less than about 5 microns.

* * * * *